United States Patent [19]

Pappas

[11] Patent Number: 4,484,215

[45] Date of Patent: Nov. 20, 1984

[54] FLEXIBLE MOUNTING SUPPORT FOR WAFER SCALE INTEGRATED CIRCUITS

[75] Inventor: Nicholas L. Pappas, Sunnyvale, Calif.

[73] Assignee: Burroughs Corporation, Detroit, Mich.

[21] Appl. No.: 546,407

[22] Filed: Dec. 8, 1983

Related U.S. Application Data

[63] Continuation of Ser. No. 264,978, May 18, 1981, abandoned.

[51] Int. Cl.³ .................. H01L 39/02; H01L 23/28; H01L 25/04; H01L 23/48
[52] U.S. Cl. ........................................ 357/80; 357/74; 357/72; 357/70; 357/82; 357/81
[58] Field of Search ................... 357/74, 72, 80, 70, 357/82, 81

[56] References Cited

U.S. PATENT DOCUMENTS

| | | | |
|---|---|---|---|
| 3,706,010 | 12/1972 | Laermer et al. | 357/82 |
| 3,753,054 | 8/1973 | Johnson | 357/74 |
| 3,763,404 | 10/1973 | Aird | 357/70 |
| 3,838,984 | 10/1974 | Crane et al. | 357/72 |
| 3,881,181 | 4/1975 | Khajezadeh | 357/82 |
| 4,139,859 | 2/1979 | Lewis et al. | 357/74 |
| 4,203,127 | 5/1980 | Tegge, Jr. | 357/74 |
| 4,288,841 | 9/1981 | Gogal | 357/70 |

Primary Examiner—Martin H. Edlow
Assistant Examiner—Jerome Jackson, Jr.
Attorney, Agent, or Firm—Charles J. Fassbender; Mervyn L. Young; Kevin R. Peterson

[57] ABSTRACT

This disclosure relates to a flexible mounting support for a wafer scale integrated circuit system which is adapted not only to support the wafer for maximum cooling exposure but also to contain the necessary driver circuits for the transmission of signals and power between the wafer and the outside world. The mounting support is formed of a plurality of layers with apertures to receive the wafer, which layers are laminated together with certain of the layers being provided with various portions of the lead circuitry required for signal and power transmission between the wafer and the driver circuits and between the driver circuits and the outside world. In particular, this laminated layer mounting support is provided with a mounting layer of a very thin, flexible material and a slightly smaller aperture so that the wafer may be seated thereon and also make electrical contact as may be required for reverse biasing and the like. In this manner, the combination of the wafer and the mounting support may then be immersed in a cooling medium which is preferably liquid so as to provide for nucleic boiling cooling of the wafer.

6 Claims, 7 Drawing Figures

FLEXIBLE MOUNTING SUPPORT FOR WAFER SCALE INTEGRATED CIRCUITS

This is a continuation of application Ser. No. 264,978, filed May 18, 1981 now abandoned.

BACKGROUND OF THE INVENTION

1. Field of the Invention

This invention relates to a flexible mounting support for a wafer scale integrated circuit and more particularly to such a support which allows for better heat dissipation required by the increased circuit density inherent therein.

2. Description of the Prior Art

Wafer scale integrated circuits provide the advantage that interconnection between the respective subcircuits can be formed at the time of the manufacture of the wafer, thereby reducing the number of handling steps involved in the present day practice of separating the individual subcircuits from the wafer for individual packaging. Furthermore, wafer scale integration accommodates faster switching speeds since the distances between the respective circuits are substantially lessened as are the number of interconnections and bonds, therefore accommodating less probability of defective interconnections and the requirement of smaller signal propagation times.

However, thermal design considerations have been a significant barrier to commercial implementation of wafer scale integration. Present day device densities on integrated circuit chips which have been separated from a parent wafer for individual packaging have an associated power density of something less than 10 watts per square centimeter. This density becomes approximately 0.125 watts per square centimeter when the individual chip is packaged and mounted on a printed circuit board. That is to say, individualized packaging and subsequent mounting on a printed circuit board provides a significant dilution of the power density. However, with wafer scale integration, where a large number of circuits are formed on the same substrate, the power density of 10 watts per square centimeter over a comparatively large area becomes significant. Furthermore, heat expansion and contraction of the wafer can result in buckling and cracking of the wafer, particularly if it is mounted on a rigid substrate.

Except in the case of dynamic RAMs where only a portion of the circuits are active at a time, thermal conduction, convection and radiation methods of heat dissipation are not adequate for maintaining the circuitry of a wafer scale integrated system at a temperature below that at which the circuits begin to go marginal. Improvements in heat transfer coefficients can be obtained by utilizing liquid boiling or nucleic boiling mechanisms which maintain the circuitry at a temperature only slightly higher than the boiling temperature of the liquid medium employed, normally about 10° C. above the boiling temperature. In this manner, by choosing appropriate liquid medium and varying the pressure of the system, any operating temperature of the wafer scale integrated circuitry can be obtained. Such a nucleic boiling system is disclosed in the Pappas et al U.S. patent application, Ser. No. 119,046, filed Feb. 6, 1980 and assigned to the assignee of the present invention. However, it is still necessary to be able to have a mounting for the wafer scale integrated system which allows for expansion and contraction as well as much exposure of the wafer substrate to the cooling medium as possible.

It is, then, an object of the present invention to provide an improved mounting support for a wafer scale integrated circuit.

It is another object of the present invention to provide an improved flexible mounting support for a wafer scale integrated circuit which allows as much of the wafer substrate surfaces as possible to be exposed to a cooling medium.

It is still another object of the present invention to provide an improved flexible mounting support for a wafer scale integrated circuit which do not only allows for a maximum exposure of the substrate to the cooling medium but also to provide the appropriate power and signal connections as required by the circuitry on and in the wafer substrate.

SUMMARY OF THE INVENTION

In order to accomplish the above-identified objects, the present invention is directed toward a flexible mounting support for a wafer scale integrated circuit system which is adapted not only to support the wafer for maximum cooling exposure but also to contain the necessary driver circuits for the transmission of signals and power between the wafer and the outside world. The mounting support is formed of a plurality of layers with apertures to receive the wafer, which layers are laminated together with certain of the layers being provided with various portions of the lead circuitry required for signal and power transmission between the wafer and the driver circuits and between the driver circuits and the outside world. In particular, this laminated layer mounting support is provided with a mounting layer of a very thin, flexible material and a slightly smaller aperture so that the wafer may be seated thereon and also make electrical contact as may be required for reverse biasing and the like. In this manner, the combination of the wafer and the mounting support may then be immersed in a cooling medium which is preferably liquid so as to provide for nucleic boiling cooling of the wafer.

A feature, then, of the present invention resides in a mounting support for a wafer scale integrated system, which is provided with concentric apertures to receive the wafer except for one layer which is of a thin, flexible material and has a smaller aperture, and circuit lead connections which are provided to couple the wafer to other wafers of the system's input/output port.

BRIEF DESCRIPTION OF THE DRAWINGS

The above objects, advantages and features of the present invention will become more readily apparent from a review of the following specification when taken in conjunction with the drawings wherein.

GENERAL DESCRIPTION OF THE INVENTION

Figure 1:
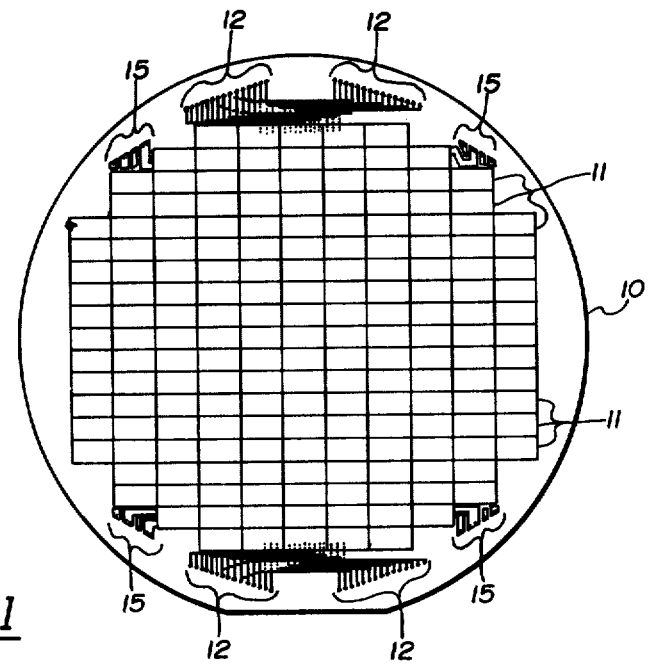
FIG. 1 is a plan view of a wafer scale system for which the present invention is designed.

A wafer scale integrated circuit system for which the present invention is adapted is illustrated in a generalized plan view of FIG. 1. Wafer substrate 10 may contain a plurality of similar circuits 11, which, for example, may each be a 16K dynamic RAM memory circuit such that a system of 64 such circuits are interconnected to form a one megabit memory. Such a wafer scale integrated system is disclosed in the Pappas patent application U.S. Ser. No. 248,355, filed Mar. 27, 1981 and assigned to the assignee of the present invention. Of course, other types of circuitry could be employed such as microprocessors which would be interconnected into a concurrent processing system.

In FIG. 1, the respective circuits 11 are interconnected by a grid of signal and timing leads 12 as well as a grid of power leads 15 for which the mounting support of the present invention must provide connection to the external world. For example, in the case of a one megabit dynamic RAM, there might be 39 input leads 12 which include seven address leads that are employed to address a storage location within a selected individual memory circuit or die, four data input leads, eight data output leads, and twenty clock signal leads where the respective clock signals are employed to select a particular memory circuit to which data is to be entered or from which data is to be read out.

Figure 2:
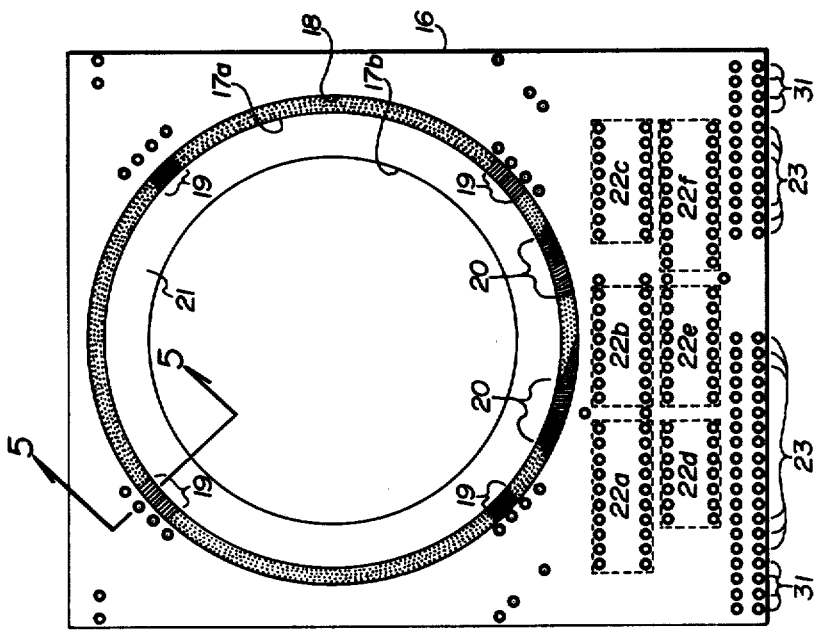
FIG. 2 is a plan view of the mounting support of the present invention.

A plan view of the mounting support of the present invention is illustrated in FIG. 2. The support is comprised of laminated circuit board 16, respective layers of which contain aperture 17a to receive the wafer of FIG. 1 with the bottom layer containing a slightly smaller aperture 17b so as to provide support against which the wafer rests after the respective bonding connections have been made as will be discussed further below. This bottom layer is of a thin flexible material so as to supply the flexible mounting of the present invention. As indicated in FIG. 2, this bottom layer contains a metallic contact ring 21 to provide for grounding or for a reverse biasing of the wafer substrate if so desired.

Sandwiched among the laminated layers are power leads 19 and signal and clocking leads 20 to accommodate such bonding operations. The top layer is provided with an enlarged aperture 18 so as to expose these leads for connection to the wafer. The signal and clocking leads 20 are driven by circuit drivers 22a, . . . , f which in turn receive signals from and supply signals to input-/output connections 23 which accommodate connection of the wafer and mounting assembly to a mother board or other appropriate structure. The function of the respective driver circuits 22a, . . . , f is to supply sufficient power to the wafer and it will be appreciated that the interconnection grids on the wafer of FIG. 1 are characterized by high capacitances and other impedances. Conversely, the signals received from the wafer of FIG. 1 will have suffered signal loss and are amplified by the respective driver circuits for transmission to other systems outside of the wafer as was described above.

Figure 4A:
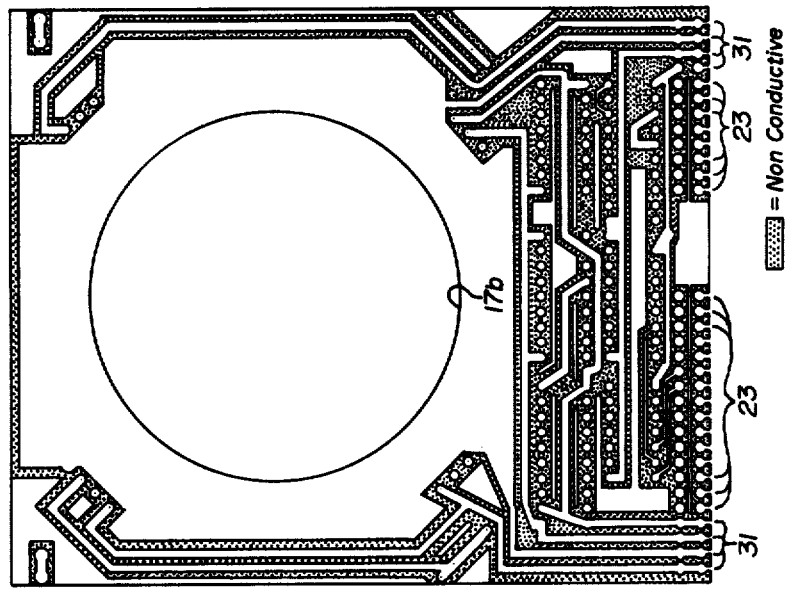
FIG. 4A, B, and C are plan views of the respective circuits embodied in the mounting support of the present invention.
Figure 3:
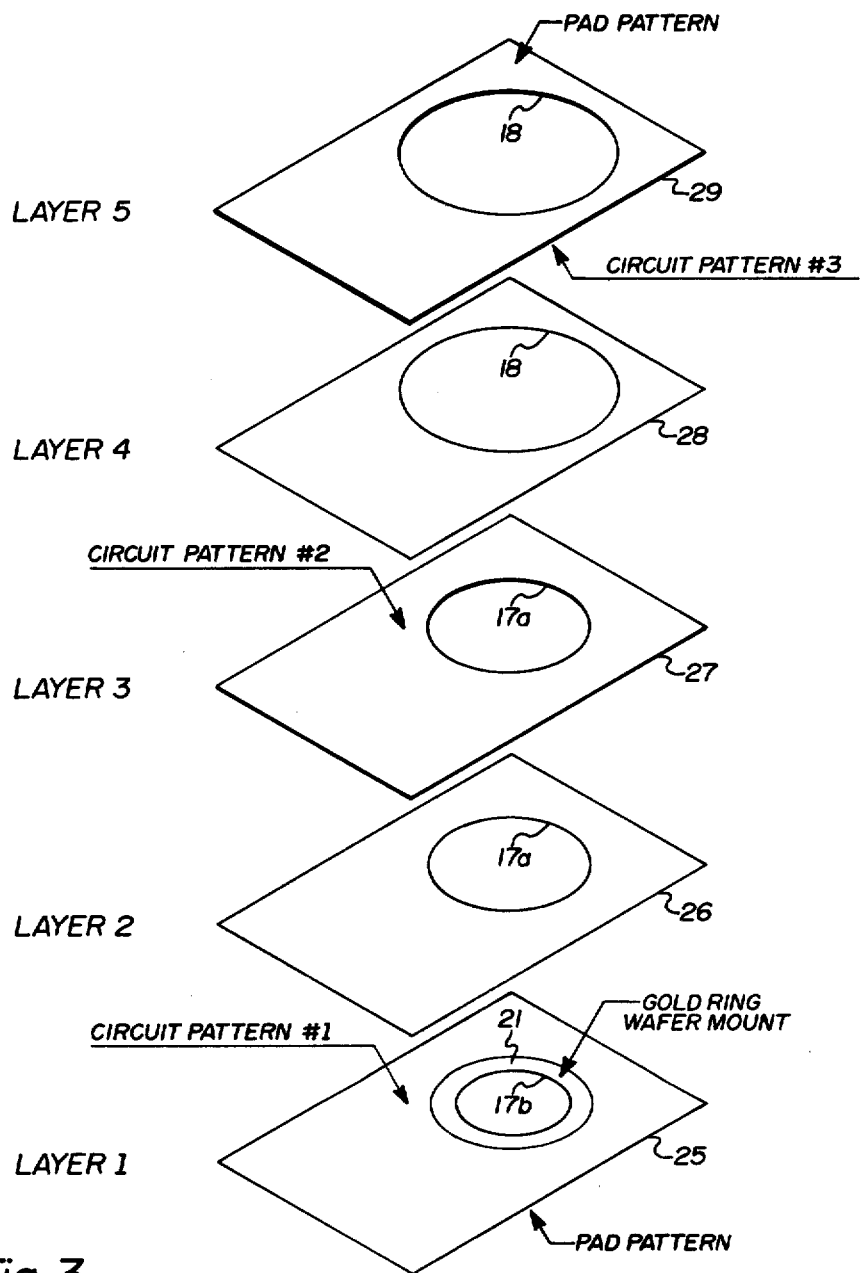
FIG. 3 is an exploded pictorial view of the mounting support of FIG. 2.

The various layers of the laminated mounting support of the present invention are illustrated in FIG. 3 which is an exploded view of the mounting support prior to its lamination. The first or bottom layer 25 is formed of a double copper clad polyimide material such as KAPTON that may be obtained from duPont Company. The polyimide layer is only one mil thick and it is this layer that provides the flexible wafer mount to which the back side of the integrated circuit wafer is bonded. As illustrated in FIG. 3, the top side of layer 25 is etched to provide the first circuit pattern which primarily supplies the different power voltages as was described above. This pattern is illustrated in FIG. 4A.

Figure 4C:
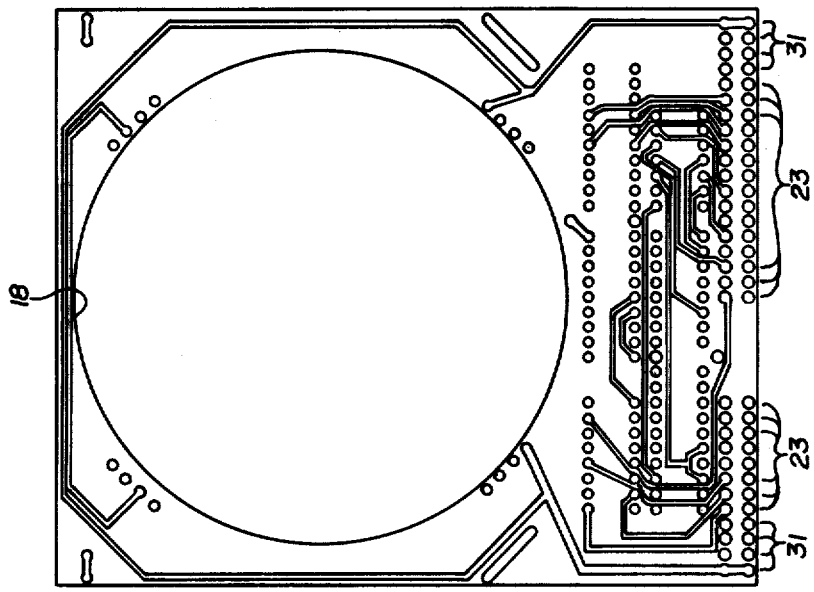
Figure 4B:
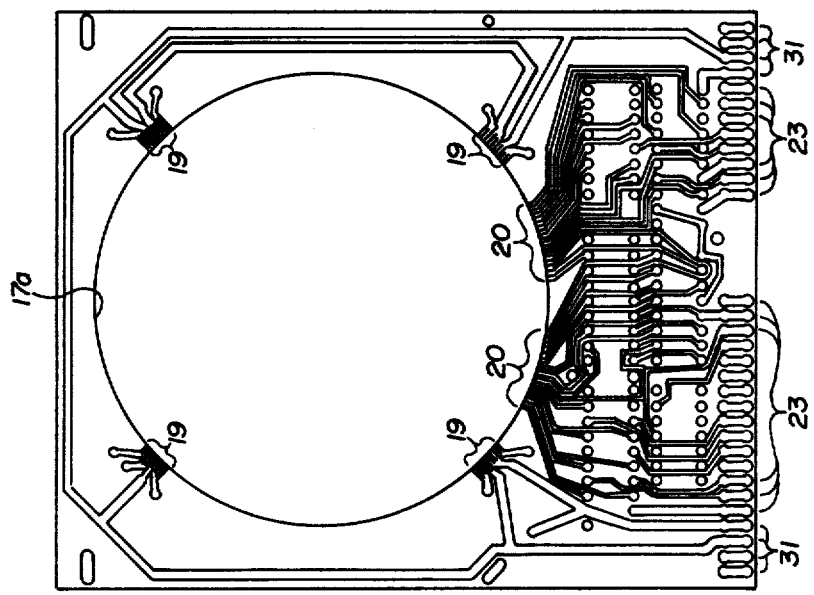

The second layer illustrated in FIG. 3 as layer 26 is a bondply layer formed of a one mil Kapton material with a mil of adhesive on both sides, as is layer 28 illustrated in FIG. 3 as layer 4. Layers 26 and 28 serve to bond the respective circuit patterns together during the lamination process, as will be more thoroughly described below. The second circuit pattern which is primarily to supply the data and clocking signals to the wafer is formed from a copper clad layer 27 of an epoxy-glass upon which the second circuit is etched. A specific example of this second circuit pattern is illustrated in FIG. 4B.

A third circuit pattern of FIG. 3, which is primarily a supplemental signal circuit and power supply pattern is etched on the bottom side of layer 29 of FIG. 3 which again is a copper clad epoxy-glass layer. The supplemental circuit pattern is of the type illustrated in FIG. 4C.

After the respective apertures 17a and 18 have been routed out of the corresponding layers, the respective layers are laminated together, the respective contact pin holes are drilled and the final plating process is performed as will be more thoroughly described below. Finally, aperture 17b of FIG. 3 is punched out to finish the flexible support mounting of the present invention.

DETAILED DESCRIPTION OF THE INVENTION

Figure 5:
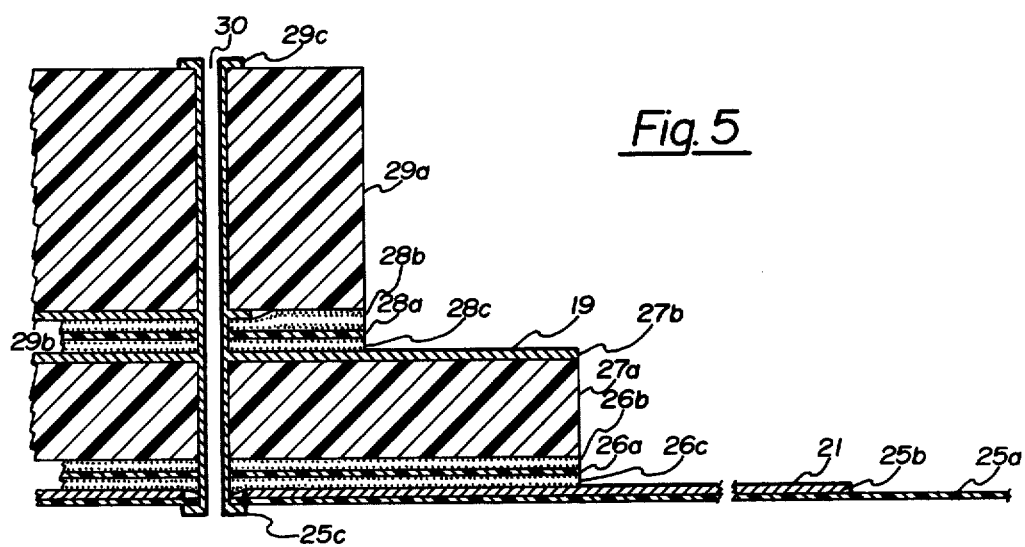
FIG. 5 is a cross-sectional view of the mounting support of FIG. 2.

A cross-sectional view of the finished mounting support of the present invention is illustrated in FIG. 5. This view is taken along cross-section 5 of FIG. 2 so as to show one of the contact plated through-holes. In FIG. 5, the flexible mounting support of the present invention is the polyimide layers 25a which is approximately one mil thick and which, as was described above, is double copper clad to provide the first circuit pattern 25b of FIG. 4A and also the contact pin pads 25c. The bondply layer 26 of FIG. 3 is formed of another polyimide layer 26a which is approximately one mil thick and is coated on both sides by adhesive layers 26b and 26c which may, for example, be acrylic or phenolic butyrals. The principal support for the mounting support is layer 27a which is an epoxy-glass such as a bisphenol-A type of structure which is provided with copper layer 27b to form the second circuit pattern such as illustrated in FIG. 4B.

A second bondply layer is formed of polyimide layer 28a which again is approximately one mil thick and is coated on both sides by adhesive layers 28b and 28c so as to provide insulation between second circuit layer 27b and a third circuit layer (of copper) 29b which is clad to epoxy-glass layer 29a and is of the same type of material as epoxy-glass layer 27a. Epoxy layer 29a is also provided with a copper layer to form the top contact pin pads 29c.

After the layers have been laminated together, the contact pin holes 30 are formed and plated through with copper to make appropriate electrical contact with the various copper circuit patterns as was described above. Then all of the exposed copper circuit patterns and pads are plated with a layer of nickel and then of gold so as to provide protection against chemical corrosion and the like. In particular, this forms gold ring 21 in FIG. 5 and also in FIG. 3 upon which the bottom side of the wafer is bonded to provide for substrate biasing as well as the flexible mounting of the wafer in such a manner as to accommodate thermal expansion and contraction of the wafer without causing it to buckle or crack.

The wafer of FIG. 1 can now be mounted in the support and bonded to gold ring 21. The bonding is accomplished by applying a silver-filled polyimide material which is spread over gold ring 21 prior to application of the wafer to ring 21 under thermal compression. To assure good electrical contact with the back side of the wafer, that back surface is sandblasted and then gold is sputtered thereon so as to reduce any current resistant losses across the surface to a minimum. The assembly is then completed by wire bonding of the respective power leads 19 and signal and clocking leads 20 of FIG. 2 to the corresponding power leads 15 and signal and timing leads 12 of the wafer of FIG. 1.

As was indicated above, the interconnections between the respective circuits on the surface of the wafer are characterized by high capacitances and signal deterioration. To this end, the signal leads 12 as well as the power leads 15 of FIG. 1 are replicated on the surface of the wafer so as to reduce current loss as well as to insure signal and power supply in case a particular connection is broken. As was indicated above, driver circuits 22a, ..., f are provided to drive the signal and timing leads 20 in the mounting support of the present invention as illustrated in FIG. 2. However, the power leads 19 of the mounting support are driven directly from the mother board and as illustrated in FIGS. 4A, ..., C are replicated to insure that power is supplied at four different points on the wafer. That is to say, the four outer connections 31 on each side of the mounting support are connected to the four groups of power leads 19 through redundant paths. In actuality, four voltages are supplied to the wafer and to the wafer substrate in contact with ring 21 of FIGS. 2, 3, and 5.

EPILOGUE

A mounting support has been described above which is adapted to receive a wafer scale integrated system and support the wafer in a flexible manner so as to reduce the possibility of wafer cracking due to thermal expansion and contraction. The mounting support also allows as much as possible of both surfaces of the wafer to be exposed to a cooling medium for a maximum heat transfer away from the wafer.

While but one embodiment of the present invention has been described, it will be apparent of those skilled in the art that variations and modifications may be made therein without departing from the spirit and scope of the invention as claimed.

What is claimed is:

1. A mounting support for transferring electrical signals between said support and the frontside surface of an integrated circuit wafer while exposing nearly all of the wafer's frontside and backside surfaces to a cooling medium for maximum heat transfer comprising:

a top planar member, a bottom planar member, and a central planar member which is laminated between said top and bottom planar members;

said central planar member having conductors on the surface that is laminated to said top planar member and having an aperture of a first diameter that is large enough to receive said wafer;

said bottom planar member having an aperture of a second diameter that is slightly smaller than said first diameter, is concentric with the aperture of said central planar member, and exposes the entire backside surface of said wafer to said cooling medium except for the periphery thereof which is supported by said bottom member around its aperture; and said top planar member having an aperture of a third diameter that is slightly larger than said first diameter, is concentric with the aperture of said central member, and exposes the entire frontside surface of said wafer to said cooling medium as well as portions of the conductors on said central member to enable electrical connections to be made between said wafer and said exposed conductor portions on said central member.

2. A mounting support according to claim 1 wherein said bottom member is formed of a flexible material which expands and contracts with said wafer when the wafer is subjected to temperature excursions so that said wafer does not buckle or crack.

3. A mounting support according to claim 1 wherein said bottom member is formed of a film which is substantially thinner than said wafer and said top and central member.

4. A mounting support according to claim 1 wherein said bottom member is formed of a flexible polyimide.

5. A mounting support according to claim 1 wherein said bottom member is only about 1 mil thick.

6. A mounting support for an integrated circuit semiconductor wafer, comprising:

a planar body having a hole that is shaped to receive said wafer, and having conductors on one surface thereof for receiving electrical signals from said wafer;

a support member for supporting said wafer that is fixedly attached to said body;

said support member having an aperture that is aligned with said hole and is slightly smaller than said wafer so that only the perimeter of said support member around said aperture makes face-to-face contact with said wafer; and said perimeter portion being the only support for said wafer, and being formed of thin, planar, flexible material which expands and contracts with said wafer when the wafer is subjected to temperature excursions.

* * * * *